(12) United States Patent
Friedman

(10) Patent No.: US 6,345,851 B1
(45) Date of Patent: Feb. 12, 2002

(54) ROBOTIC GRIPPING DEVICE FOR GRIPPING AN OBJECT HAVING A HANDLE ON AN UPPER SURFACE

(75) Inventor: Gerald M. Friedman, New Ipswich, NH (US)

(73) Assignee: PRI Automation, Inc., Billerica, MA (US)

( * ) Notice: Subject to any disclaimer, the term of this patent is extended or adjusted under 35 U.S.C. 154(b) by 0 days.

(21) Appl. No.: 09/506,138

(22) Filed: Feb. 17, 2000

Related U.S. Application Data

(60) Provisional application No. 60/120,346, filed on Feb. 17, 1999.

(51) Int. Cl.[7] .................................................. B66C 1/66
(52) U.S. Cl. ........................... 294/86.4; 294/90; 901/30
(58) Field of Search .......................... 294/1.1, 15, 27.1, 294/67.1, 67.3, 68.1, 68.3, 82.24, 82.27, 82.3, 82.31, 82.34, 86.26, 86.33, 86.4, 89, 90, 91; 244/137.4, 158 R, 161; 901/30, 31, 39

(56) References Cited

U.S. PATENT DOCUMENTS

| | | |
|---|---|---|
| 3,342,520 A | 9/1967 | Haynes |
| 4,035,010 A | 7/1977 | Kawashita et al. ........ 294/81.1 |
| 4,105,241 A | 8/1978 | Mee ........................... 294/86.4 |
| 4,173,324 A | 11/1979 | Rudman ..................... 244/161 |
| 4,360,230 A | 11/1982 | Wood et al. ................. 294/90 |
| 4,645,256 A | 2/1987 | Zeh ............................ 294/86.4 |
| 4,682,927 A | 7/1987 | Southworth et al. ........ 414/217 |
| 4,750,769 A | 6/1988 | Tebb .......................... 294/86.4 |
| 4,762,353 A | 8/1988 | Molinaro .................... 294/1.1 |
| 4,816,732 A | 3/1989 | Wilson ....................... 318/568 |
| 4,904,153 A | 2/1990 | Iwasawa et al. ............ 414/735 |
| 4,952,299 A | 8/1990 | Chrisos et al. ......... 204/298.25 |
| 5,161,845 A | 11/1992 | Carpenter, Jr. .............. 294/90 |
| 5,474,410 A | 12/1995 | Ozawa et al. ............... 414/217 |
| 5,797,638 A | 8/1998 | Yamazaki et al. ............ 294/97 |

*Primary Examiner*—Johnny D. Cherry
(74) *Attorney, Agent, or Firm*—Weingarten, Schurgin, Gagnebin & Lebovici LLP

(57) ABSTRACT

A wafer pod handling device engages a pod for transport through a flange on top of the pod by receiving the flange into a receptacle and rotating a circular disk having a square aperture such that edges on the disk are positioned beneath an overhang on the flange. As the circular disk is lifted, the edges contact the overhang of the flange and lift the pod. The circular disk is mounted in a housing having a lip adapted to slideably engage the circumference of the circular disk. An actuator on top of the housing rotates the disk into engagement with the flange. As the housing is lifted, the circumference of the circular disk rests on the lip to frictionally secure and support the circular disk despite power failures or accidental rotation that could disengage the pod.

28 Claims, 4 Drawing Sheets

ROBOTIC GRIPPING DEVICE FOR GRIPPING AN OBJECT HAVING A HANDLE ON AN UPPER SURFACE

CROSS REFERENCE TO RELATED APPLICATIONS

This application claims priority under 35 U.S.C. § 119(E) OF U.S. provisional patent application No. 60/120,346, entitled Eighth-Turn Gripper, filed Feb. 17, 1999, the disclosure of which is incorporated by reference herein.

STATEMENT REGARDING FEDERALLY SPONSORED RESEARCH OR DEVELOPMENT

Not Applicable

BACKGROUND OF THE INVENTION

Robotic devices are known which transport various articles of manufacture around a manufacturing facility. In semiconductor wafer manufacturing operations, robotic devices are used to transport carriers such as cassettes containing semiconductor wafers through various stages of the wafer manufacturing process. These cassettes, or pods, are frequently lifted and moved by such robotic devices. One type of pod includes a handle or crown extending from the upper surface of the pod that can be grasped by an overhead robot arm. This crown includes a plate attached to a stem. The plate extends beyond or overhangs the sides of the stem to form a flange that can be grasped by the robot arm.

Wafer manufacturing operations typically require a contaminant-free environment, or clean room. Particulate contaminants which can be generated by mechanical abrasion and lubricants are avoided in a clean room environment. Accordingly, robotic devices for use in a clean room minimize moving and motorized parts which can contribute to particulate contamination.

Further, wafer pods concentrate a substantial quantity of wafer product in a common payload element. Bumping, jarring, and dropping of a wafer pod, such as through a power failure or operator error, can result in substantial payload losses. Also, efficiency of space suggests that clean room robotics should avoid positional dependencies, such as requiring side access to a pod.

Accordingly, it would be beneficial to provide a robotic device which has minimal moving parts, which can maintain a pod payload throughout power failures and operator error, and which allows for top access to a pod to avoid imposing location constraints on adjacent robotic equipment.

BRIEF SUMMARY OF THE INVENTION

A wafer pod handling device engages a pod for transport through a flange on top of the pod by receiving the flange into a receptacle and rotating a circular disk having a square aperture such that edges on the disk are positioned beneath an overhang on the flange. As the circular disk is lifted, the edges contact the overhang of the flange and lift the pod. The circular disk is mounted in a housing having a lip adapted to slideably engage the circumference of the circular disk. An actuator on top of the housing rotates the disk into engagement with the flange. As the housing is lifted, the circumference of the circular disk rests on the lip to frictionally secure and support the circular disk despite power failures or accidental rotation which could disengage the pod.

BRIEF DESCRIPTION OF THE SEVERAL VIEWS OF THE DRAWING

The invention will be more fully understood with reference to the following detailed description and drawings, of which.

DETAILED DESCRIPTION OF THE INVENTION

A gripping device 10 for objects having a handle on the upper surface, such as a semiconductor wafer pod 28, is provided. The gripping device is typically part of a robotic hoist apparatus (not shown) that grasps the object via the handle on the upper surface, hoists the object from a support surface, transports the object to another location by various transport methods, and disengages the object at the new destination. The gripping device employs a single actuator to engage a flange on the handle, and minimizes frictional communication between moving parts to avoid abrasion which can compromise clean room conditions. Once engaged, the handle is frictionally secured to and supported by the gripping device such that power failures and unintended actuator operation will not dislodge the carrier from the gripping device.

Figure 1:
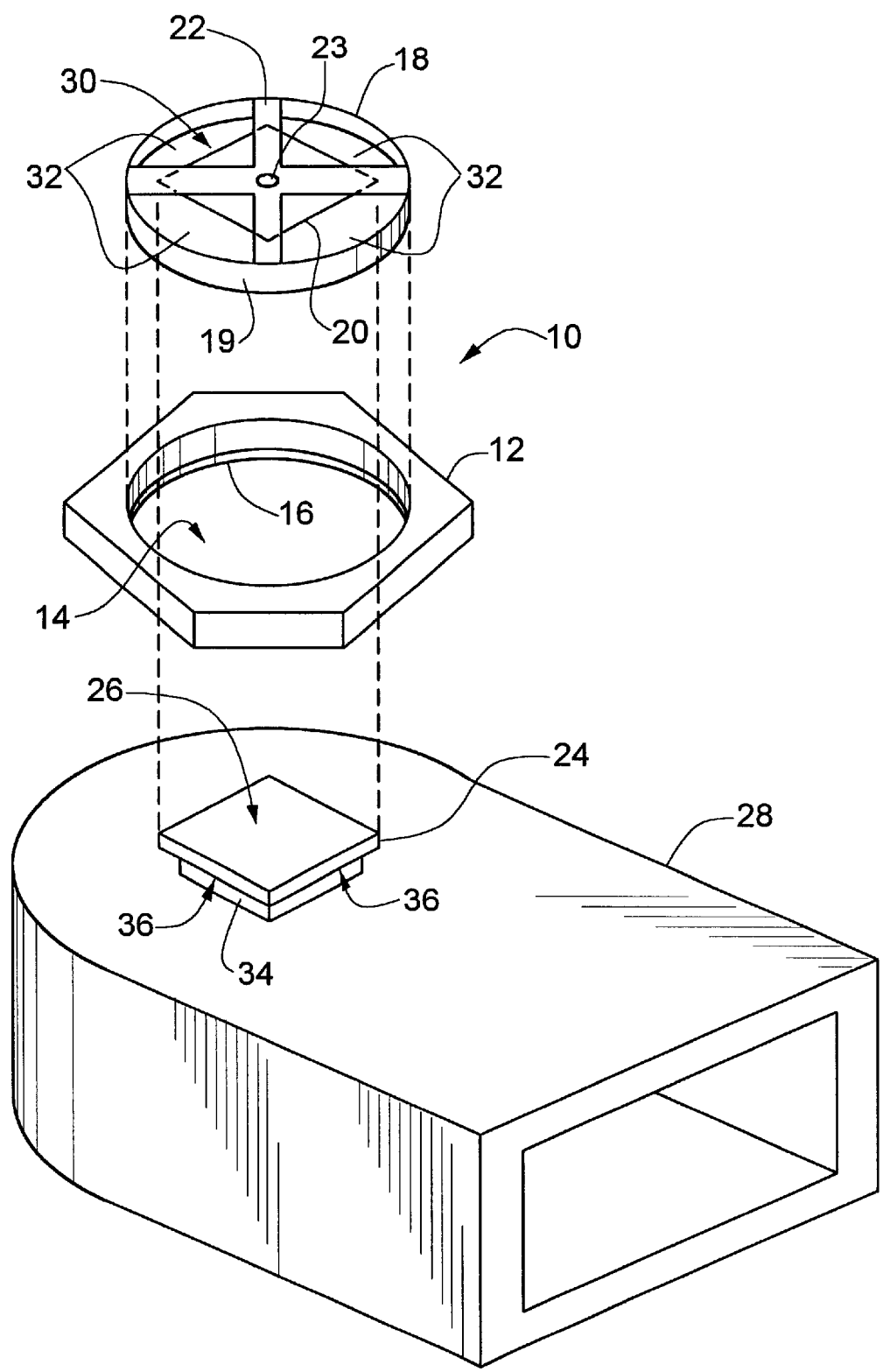
FIG. 1 is an exploded view of a gripping device in association with a carrier having a top flange in accordance with the present invention.

Referring to FIG. 1, the gripping device 10 is shown in an exploded view. The gripping device includes a housing 12 and a gripping element 18. The housing is generally plate-like, having an upper and lower surface. Although the housing is illustrated as having a hexagonal outer configuration, the housing may have other outer configurations as desired. The housing includes a circular aperture in the lower surface and a generally circular interior extending from the upper to the lower surface. An inwardly facing annular lip 16, typically extending in or near the plane of the lower surface, is provided, which supports the gripping element.

The gripping element 18 is sized to rest on the lip 16 and slideably rotate within the circular interior 14. The gripping element includes a circular rim 19 and a lower plate 21 having a square or substantially square opening 20 therein, illustrated more fully in FIG. 2b. The portions of the lower plate adjacent each side of the square opening form support edges or shoulders 32, described further below. The gripping element also includes four flexure arms 22 that meet at the center of the gripping element. An attachment device or protrusion 23 is provided at the meeting point for connection to a motor or other actuator that is operative to rotate the gripping element, also described further below.

The square aperture 20 is slightly larger than a flange 24 of the crown 26 attached to the pod 28. As the housing 12 is lowered onto the top of the crown 26 by a hoist apparatus (not shown), the flange 24 is received into a receptacle 30 defined above the square aperture 20. The gripping element 18 is then rotated 45° or one-eighth of a 360° turn such that the edges 32 of the gripping element 18 underlie an overhang 36 on the underside of the flange 24. As the housing 12 is lifted, the lip 16 supports the circular disk 18, and the edges 32 contact the underside of the overhang 36 to support the flange 24 of the crown 26 and the attached pod 28 via a stem 34.

Figure 2A:
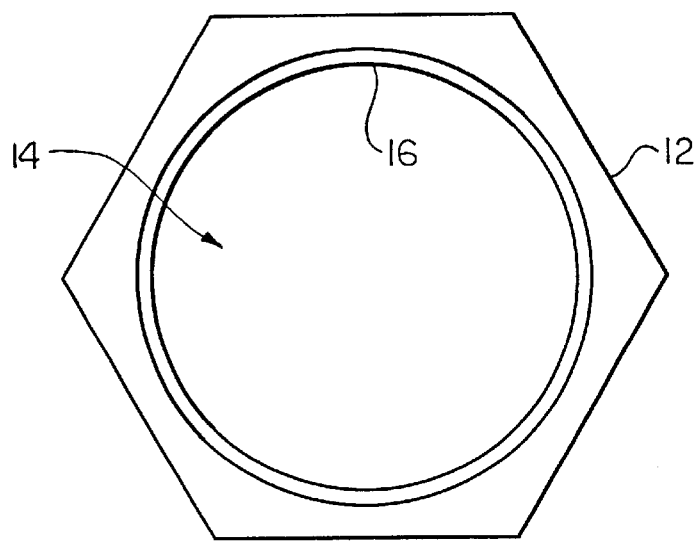
FIG. 2a is a top view of the housing of the gripping device of FIG. 1.
Figure 2B:
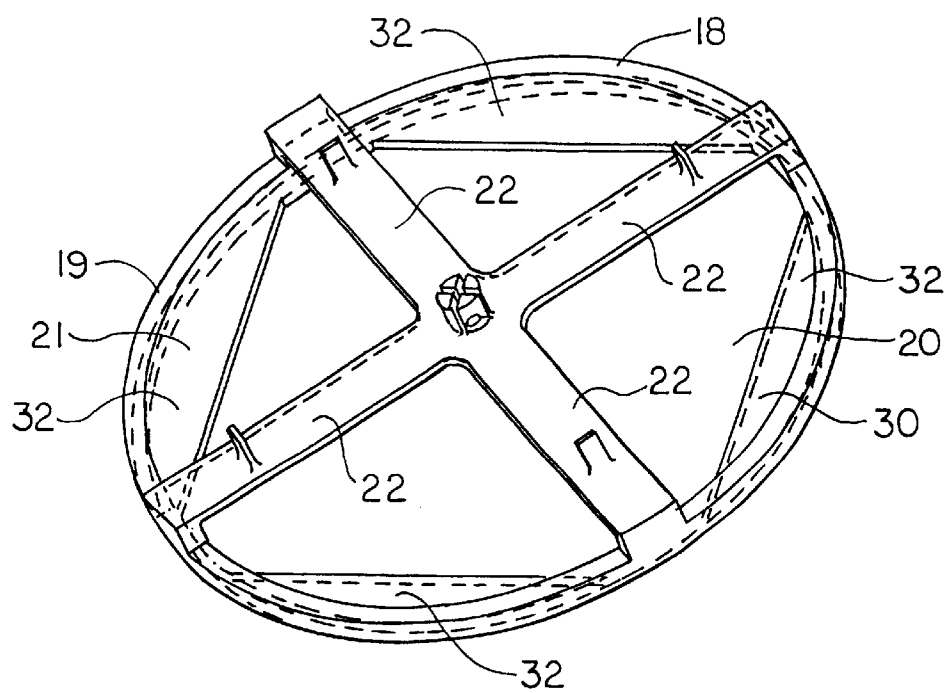
FIG. 2b is an isometric view of the gripping element of the gripping device of FIG. 1.

Referring to FIGS. 2a and 2b, a top view of the housing 12 and the gripping element 18 is shown. The gripping element 18 has a diameter slightly smaller than the diameter of the circular interior 14 of the housing, but slightly larger than the diameter of the lip 16. In this manner, the circular disk 18 is adapted to slideably rotate on the lip within the interior 14.

Figure 3A:
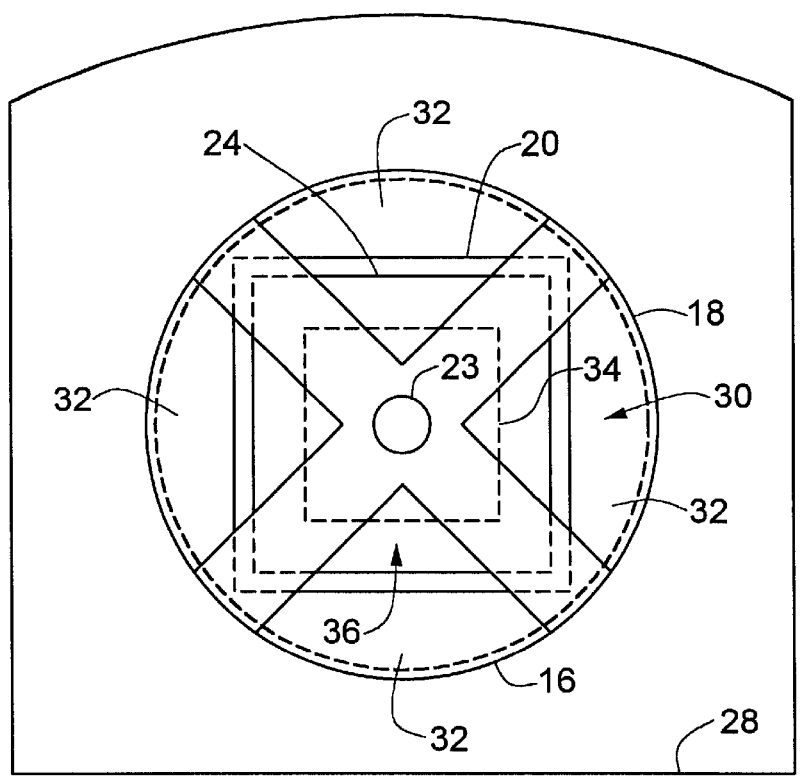
FIG. 3a shows a top view of the gripping element receiving the flange.
Figure 3B:
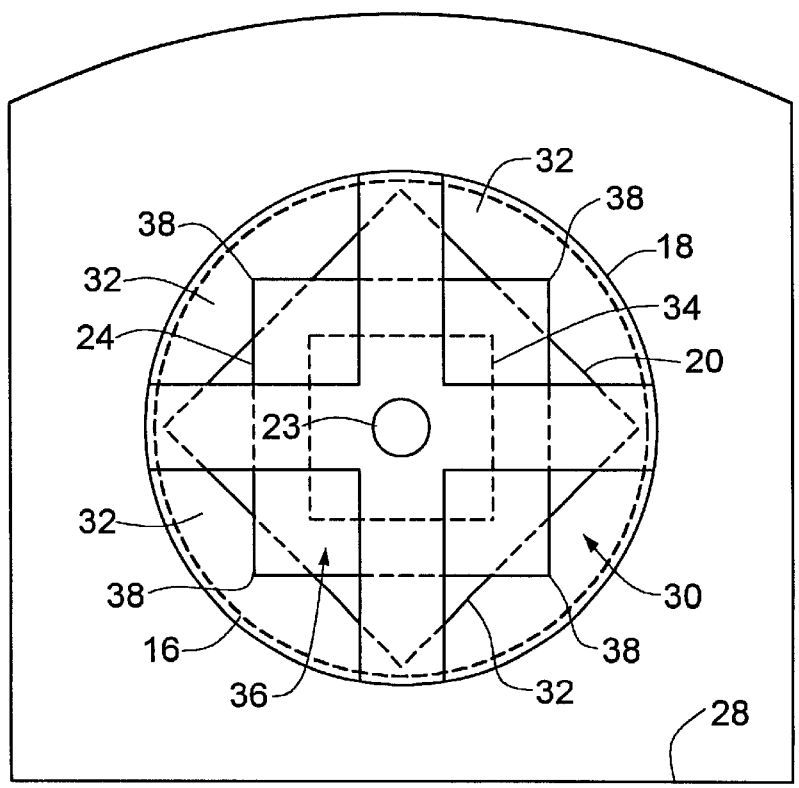
FIG. 3b shows a top view of the gripping element engaging the flange.

Referring to FIGS. 3a and 3b, the gripping element 18 is shown receiving and engaging the flange 24. In FIG. 3a, the square aperture 20 receives the flange 24. Each side of the square aperture 20 is slightly longer than each side of the flange 24, such that the flange 24 is received through the aperture 20 into the receptacle 30 defined by the interior of the gripping element 18. As the flange 24 is fully received into the receptacle 30, the edges 32 have sufficient clearance with the stem 34 that rotation of the gripping element 18 brings the edges 32 between the pod 28 and the flange 24 in the area defined by the overhang 36. In FIG. 3b, the gripping element 18 has been rotated one-eighth of a turn and the edges 32 are brought underneath the corners 38 of the flange 24. The flange 24 and attached pod 28 can be lifted by the gripping element 18 and housing 12 (FIG. 1).

Figure 4A:
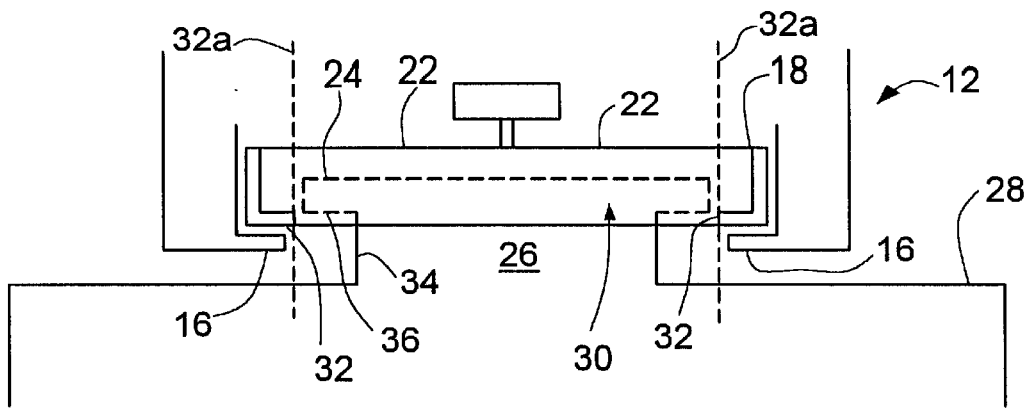
FIG. 4a shows a side view of the housing receiving the flange.
Figure 4B:
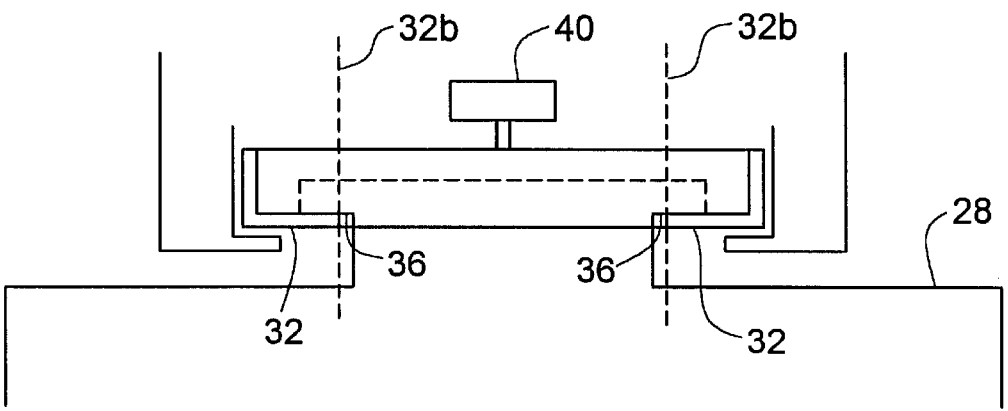
FIG. 4b shows a side view of the housing engaging the flange.
Figure 4C:
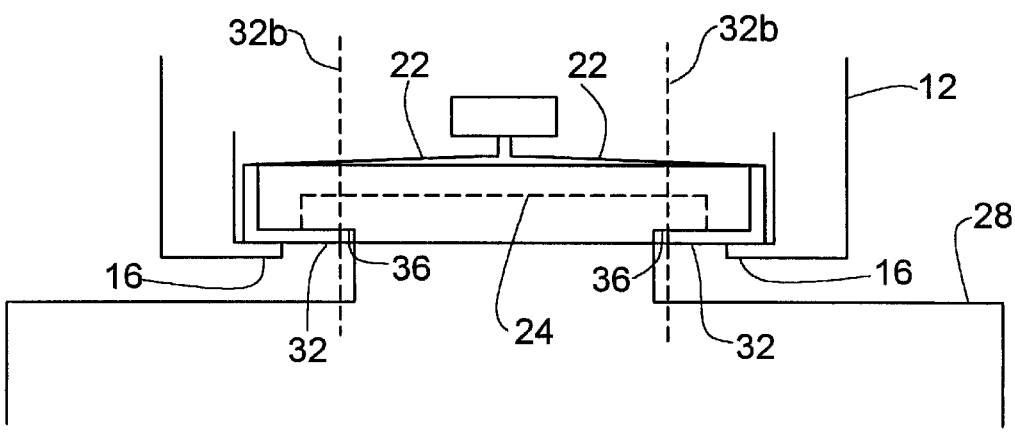
FIG. 4c shows a side view of the housing lifting the carrier.

The operation of the gripping device is described further with respect to FIGS. 4a–4c. The housing 12 is lowered by a hoist apparatus (not shown) onto the crown 26 and the flange received into the receptacle 30, as described above. The gripping element 18 rests slideably on or disposed slightly above the lip 16. The edges 32 of the gripping element are aligned as indicated by dotted line 32a allowing the flange to pass through the square aperture 20.

When the flange is fully received, an actuator 40, also attached to the hoist apparatus, rotates the gripping element 18 via the flexure arms 22 through an attachment aperture 23. The actuator could be any suitable drive device adapted for clean room operation, such as a stepper motor, brushless DC motor, or rotary solenoid. The size and power of the actuator are selected such that the actuator is incapable of rotating the gripping element 18, and thus releasing the pod 20 against the friction between the flange 24, gripping element 18, and lip 16 due to the downward force exerted by the flange and pod as described further below. The edges are brought between the flange 24 and the pod 28 in the area defined by the overhang 36. The edges 32 are aligned in the position shown by dotted line 32b.

In FIG. 4c, the transport device raises the housing 12 and actuator 40. The edges 32, still aligned with the position shown by dotted line 32b, contact the underside of the flange 24 at the overhang 36. As the gripping element 18 is now bearing the weight of the flange 24 and the attached pod 28, the flexure arms 22 deflect slightly until the gripping element 18 contacts and bears upon the lip 16. The housing continues upward by the hoist apparatus. As the lip is bearing the weight of the pod, friction between the lip and the gripping element 18 prevents undesired rotation, such as through accidental actuator operation, which could cause a pod to be dropped. Similar friction secures and supports the overhang 36 on the edges 32.

In alternate embodiments the flange and aperture could be a polygon other than a square, as long as the rotation of the circular disk is sufficient to bring the edges of the circular disk into the overhang area defined by the flange.

Those of ordinary skill in the art should further appreciate that variations to and modification of the above-described methods and devices for providing gripping devices for a semiconductor wafer pod may be made without departing from the inventive concepts disclosed herein. Accordingly, the invention should be viewed as limited solely by the scope and spirit of the appended claims.

What is claimed is:

1. An engaging device for an object having a handle with a flange extending from a pedestal on an upper surface of the object, the gripping device comprising:
   a housing, a circular aperture formed in said housing;
   a gripping element rotatably disposed within said housing for rotation about a vertical axis, said gripping element including a receptacle having inwardly facing edges configured to allow passage of the flange therethrough in a first orientation and further configured to support the flange on the inwardly facing edges upon rotation of said gripping element in said housing about the vertical axis to a second orientation.

2. The engaging device of claim 1 wherein said housing further comprises an inwardly facing annular lip around said aperture below a top surface of said housing.

3. The engaging device of claim 2 wherein said gripping element is disposed in said housing above said lip and adapted to be supported by said lip.

4. The engaging device of claim 1 wherein said second orientation is 45° from said first orientation.

5. The engaging device of claim 1 wherein said flange has a polygonal configuration and said receptacle has a corresponding polygonal aperture having sides longer than a side of said flange.

6. The engaging device of claim 5 wherein said polygonal configuration is square.

7. The engaging device of claim 6 wherein said flange is part of a crown further comprising a stem portion and an overhand portion defined by said flange and said edges are adapted to be disposed beneath said overhang portion when said gripping element is rotated.

8. The engaging device of claim 7 wherein said gripping element further comprises flexure arms attached to the outer circumference of said gripping element.

9. The engaging device of claim 8 wherein said flexure arms are resilient.

10. The engaging device of claim 9 wherein said crown is attached to the object and said flexure arms are adapted to deform via downward force from said object.

11. The engaging device of claim 10 wherein said flexure arms are deformable such that said gripping element is frictionally secured to said lip when said gripping element is engaging the flange in the second orientation.

12. The engaging device of claim 10 wherein the object is a semiconductor wafer pod.

13. The engaging device of claim 8 further comprising an actuator attached to said flexure arms and operable to rotate said gripping element.

14. The engaging device of claim 13 wherein said gripping element is frictionally secured by a force from the object such that said actuator is inoperable to rotate said gripping element.

15. The engaging device of claim 13 wherein said object has inertial forces such that said actuator is inoperable to rotate said gripping element due to said inertial forces.

16. The engaging device of claim 5 wherein the edges are defined by the portion of said gripping element outside the perimeter of said polygon aperture.

17. A gripping device for an object having a handle with a flange extending from a pedestal on an upper surface of the object, the gripping device comprising:

a housing, an aperture formed in said housing, and an inwardly facing lip around said aperture below a top surface of said housing;

a gripping element comprising:
- a peripheral rim disposed within said housing above said lip, the rim sized to be supported by said lip,
- a receptacle formed in the gripping element and configured to receive and support the flange of the object therein, and
- a resilient support structure attached to said rim above said receptacle, the resilient support structure operable to flex upon application of a lifting force in opposition to a downwardly directed force from the object supported by the gripping element, whereby the gripping element frictionally rests upon said inwardly facing lip of said housing.

18. The gripping device of claim 15, wherein the resilient support structure comprises a plurality of flexural arms attached to an upper portion of the peripheral rim.

19. The gripping device of claim 18, wherein the flexural arms meet at a central region of the gripping element.

20. The gripping device of claim 15, further comprising an attachment mechanism adapted to attach to a hoist apparatus.

21. A semiconductor wafer pod gripping device for gripping a semiconductor wafer pod having a flange extending from a pedestal on an upper surface of the pod, the gripping device comprising:

a housing, a circular aperture formed in said housing, and an inwardly facing annular lip around said aperture below a top surface of said housing;

a gripping element rotatably disposed within said housing above said lip to be supported by said lip, said gripping element comprising:

a receptacle having inwardly facing edges configured to allow passage of the flange therethrough in a first orientation and further configured to support the flange on the inwardly facing edges upon rotation of said gripping element in said housing to a second orientation;

a peripheral rim disposed within said housing above said lip, the rim sized to be supported by said lip, and a resilient support structure attached to said rim above said receptacle, the resilient support structure operable to flex upon application of a lifting force in opposition to a downwardly directed force from the object supported by the gripping element, whereby the gripping element frictionally rests upon said inwardly facing lip of said housing.

22. A method of engaging a payload comprising:

providing a housing having an interior with a lip;

disposing a rotatable gripping element having an aperture inside said housing;

providing a flange attached to a payload and adapted to be disposed through said aperture;

lowering said housing onto said payload such that said flange is disposed through said aperture;

rotating said rotatable gripping element about a vertical axis such that edges of said aperture engage said flange; and raising said housing such that said edges contact and support said flange.

23. The method of claim 22 wherein said interior is circular.

24. The method of claim 23 wherein said aperture is a polygon.

25. The method of claim 24 wherein said flange is a polygon having shorter sides than said aperture.

26. The method of claim 25 wherein said polygon is a square.

27. The method of claim 22 wherein said rotating step rotates said gripping element 45°.

28. The method of claim 22 wherein said interior has a lip around a perimeter of said interior and said raising causes said lip to contact and support said rotatable gripping element.

* * * * *

UNITED STATES PATENT AND TRADEMARK OFFICE
CERTIFICATE OF CORRECTION

PATENT NO. : 6,345,851 B1
DATED : February 12, 2002
INVENTOR(S) : Gerald M. Friedman It is certified that error appears in the above-identified patent and that said Letters Patent is hereby corrected as shown below:

<u>Column 4,</u>
Line 37, "overhand" should read -- overhang --;

<u>Column 5,</u>
Line 17, "claim 15" should read -- claim 17 --;
Line 22, "claim 15" should read -- claim 17 --.

Signed and Sealed this

Seventeenth Day of December, 2002

JAMES E. ROGAN
*Director of the United States Patent and Trademark Office*